(12) United States Patent
Kim et al.

(10) Patent No.: US 6,590,234 B2
(45) Date of Patent: Jul. 8, 2003

(54) NITRIDE SEMICONDUCTOR LIGHT-EMITTING ELEMENT AND METHOD FOR FABRICATING THE SAME

(75) Inventors: Chin Kyo Kim, Seoul (KR); Tae Kyung Yoo, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/773,508

(22) Filed: Feb. 2, 2001

(65) Prior Publication Data

US 2001/0011731 A1 Aug. 9, 2001

(30) Foreign Application Priority Data

Feb. 3, 2000 (KR) .......................................... 2000-5380

(51) Int. Cl.[7] ................................................ H01L 33/00
(52) U.S. Cl. .............................. 257/94; 257/94; 257/99; 257/101; 257/103
(58) Field of Search .............................. 257/94, 96, 98, 257/190

(56) References Cited

U.S. PATENT DOCUMENTS 6,266,355 B1 * 7/2001 Sverdlov ...................... 372/45
6,288,417 B1 * 9/2001 Nickel et al. ................ 257/103
6,466,597 B1 * 10/2002 Kume et al. .................. 372/45

* cited by examiner

Primary Examiner—Long Pham
Assistant Examiner—Wai-Sing Louie
(74) Attorney, Agent, or Firm—Morgan, Lewis & Bockius LLP

(57) ABSTRACT

A nitride semiconductor light-emitting element is disclosed. An n type AlGaN cladding layer is grown on a GaN substrate, and an InGaN active layer of a quantum well structure is grown on the n type AlGaN cladding layer at a temperature of about 800° C. or less. Subsequently, a buffer layer of any one of GaN, AlGaN, and InGaN is grown on the InGaN active layer at a temperature of about 900° C. or less. A p type AlGaN cladding layer and a p type GaN electrode layer are sequentially grown on the buffer layer. A p type electrode is formed over the p type GaN electrode layer while an n type electrode is formed below the substrate or over the n type cladding layer. Thus, the nitride semiconductor light-emitting element having high efficiency optical characteristic and thermal characteristic can be obtained.

4 Claims, 2 Drawing Sheets

NITRIDE SEMICONDUCTOR LIGHT-EMITTING ELEMENT AND METHOD FOR FABRICATING THE SAME

BACKGROUND OF THE INVENTION

1. Field of the Invention

The present invention relates to a nitride semiconductor light-emitting element and a method for fabricating the same.

2. Description of the Related Art

Generally, an optical element and an electrical element based on a nitride semiconductor have been variously developed until now. Application of the nitride semiconductor becomes broad in various fields. Actually, a light-emitting diode and a laser diode based on the nitride semiconductor are used in a display, such as a colored electric sign and a signal lamp, and in a pickup device of an optical recording medium with high density.

Such a nitride semiconductor can have an energy band gap Eg of about 1.95~6.0 eV depending on its composition. In this respect, it has received much attention as a material of a semiconductor light-emitting element such as a light-emitting diode and a laser diode.

A general laser diode has a confined structure in which light and carrier are respectively confined. In other words, an InGaN active layer is formed between GaN wave guide layers, and an AlGaN cladding layer is formed around the GaN wave guide layers.

Such a laser diode has a multilayered complex structure, and various variations can be made in its structure to implement an optimal structure for improvement of optical characteristic and thermal characteristic.

However, very high stress occurs between the wave guide layer and the active layer due to the difference of lattice constants between the GaN and AlGaN used as materials of the wave guide layer and the cladding layer and the InGaN used as a material of the active layer. This causes a large quantity of cracks.

In more detail, in fabricating the semiconductor laser diode, if the AlGaN cladding layer and the GaN wave guide layer are directly grown at a high temperature of about 1000° C. or greater on the InGaN active layer formed at a low temperature of about 800° C. or less, In within the InGaN active layer is evaporated by heat. This could lead to an uneven composition of In within the active layer and a rough interface of the active layer, thereby remarkably deteriorating optical characteristic.

SUMMARY OF THE INVENTION

Accordingly, the present invention is directed to a nitride semiconductor light-emitting element and a method for fabricating the same that substantially obviate one or more of the problems due to limitations and disadvantages of the related art.

An object of the present invention is to provide a nitride semiconductor light-emitting element and a method for fabricating the same, in which a rough interface caused by a difference between lattice constants is prevented from occurring.

Another object of the present invention is to provide a nitride semiconductor light-emitting element and a method for fabricating the same, in which low carrier confinement efficiency is improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a nitride semiconductor light-emitting element according to the present invention includes a substrate, a first conductivity type cladding layer formed on the substrate, an active layer formed on the first conductivity type cladding layer, a second conductivity type cladding layer formed on the active layer, a buffer layer formed either between the first conductivity type cladding layer and the active layer or between the second conductivity type cladding layer and the active layer, a second conductivity type electrode formed over the second conductivity type cladding layer, and a first conductivity type electrode formed either below the substrate or over the first conductivity type cladding layer.

The buffer layer has a thickness of 0.01~5 nm, and is formed of one of GaN, AlGaN, and InGaN if the active layer is formed of InGaN.

If the buffer layer is formed of InGaN, a composition of In is smaller than that of In in the active layer.

In another aspect, a method for fabricating a nitride semiconductor light-emitting element according to the present invention includes the steps of sequentially forming a first conductivity type cladding layer, an active layer, a buffer layer, and a second conductivity type cladding layer on a substrate, and forming a second conductivity type electrode over the second conductivity type cladding layer and a first conductivity type electrode either below the substrate or over the first conductivity type cladding layer.

The buffer layer may be formed before the active layer is formed on the first conductivity type cladding layer.

The active layer is grown at a low temperature of 800° C. or less, the buffer layer is grown at a low temperature of 900° C. or less, and the second conductivity type cladding layer is grown at a high temperature of 1000° C. or greater. In this case, loss of the active layer that may occur due to temperature increase is reduced. Thus, interface characteristic between the active layer and the cladding layer formed on the active layer can be improved to facilitate flow of carriers and improve efficiency of carrier confinement, thereby obtaining a nitride semiconductor light-emitting element having high efficiency optical characteristic and thermal characteristic.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Generally, in fabricating a nitride semiconductor light-emitting element, if an AlGaN cladding layer or a GaN wave guide layer is directly grown at a high temperature of about 1000° C. or greater on an InGaN active layer formed at a low temperature of about 800° C. or less, In within the InGaN active layer is evaporated by rapid temperature variation and a composition of In within the active layer becomes uneven. For this reason, a rough interface between the active layer and the cladding layer is caused, thereby remarkably deteriorating optical characteristic.

In this respect, in the present invention, a buffer layer is grown between the InGaN active layer and the AlGaN cladding layer at a low temperature so as to prevent loss of the active layer caused by rapid temperature variation.

Figure 1:
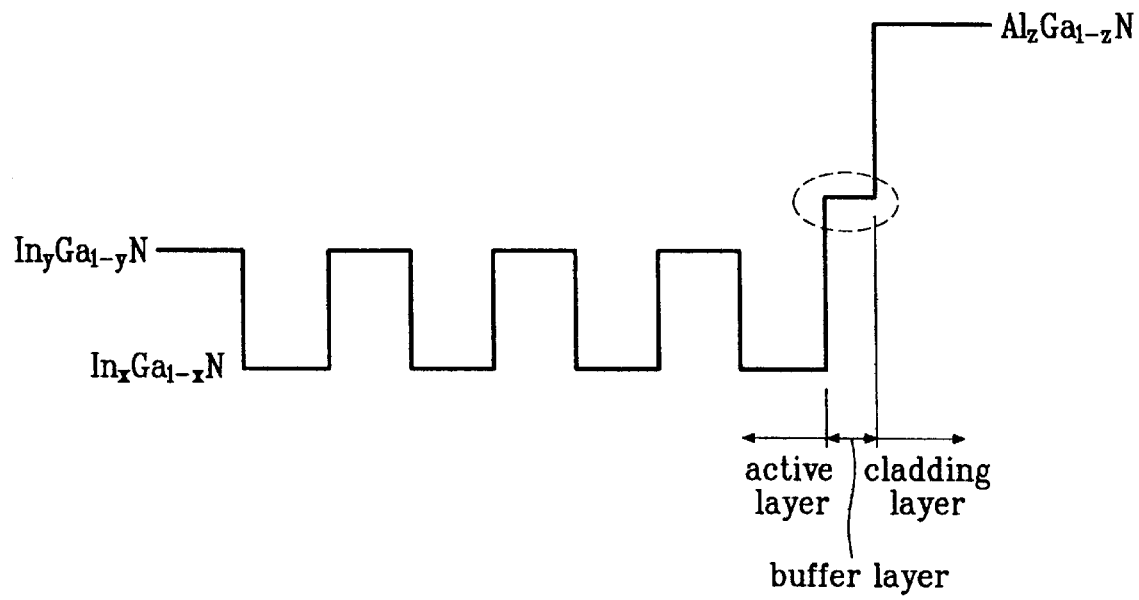
FIG. 1 shows an energy band of a nitride semiconductor light-emitting element according to the present invention.
Figure 2A:
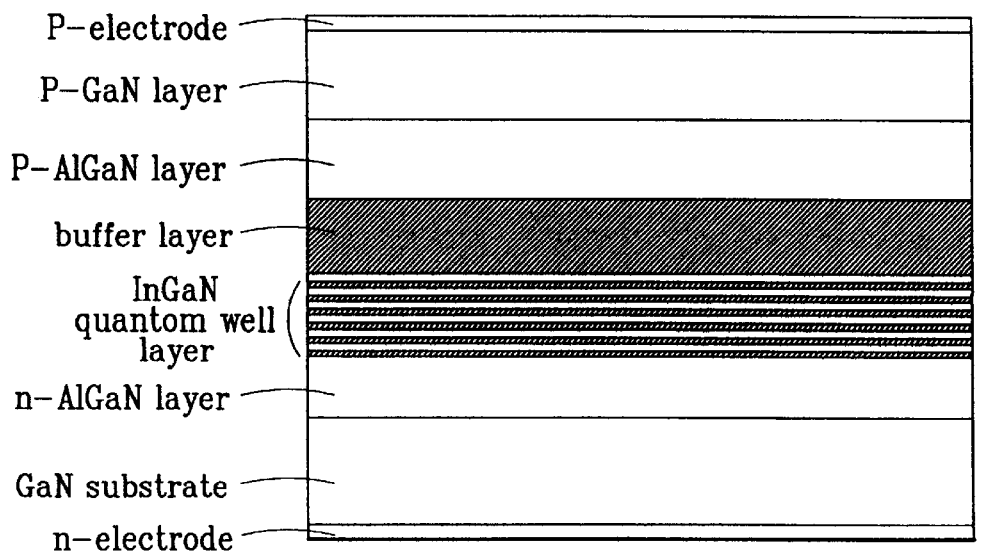
FIGS. 2A and 2B are sectional views of a nitride semiconductor light-emitting element according to the present invention.
Figure 2B:
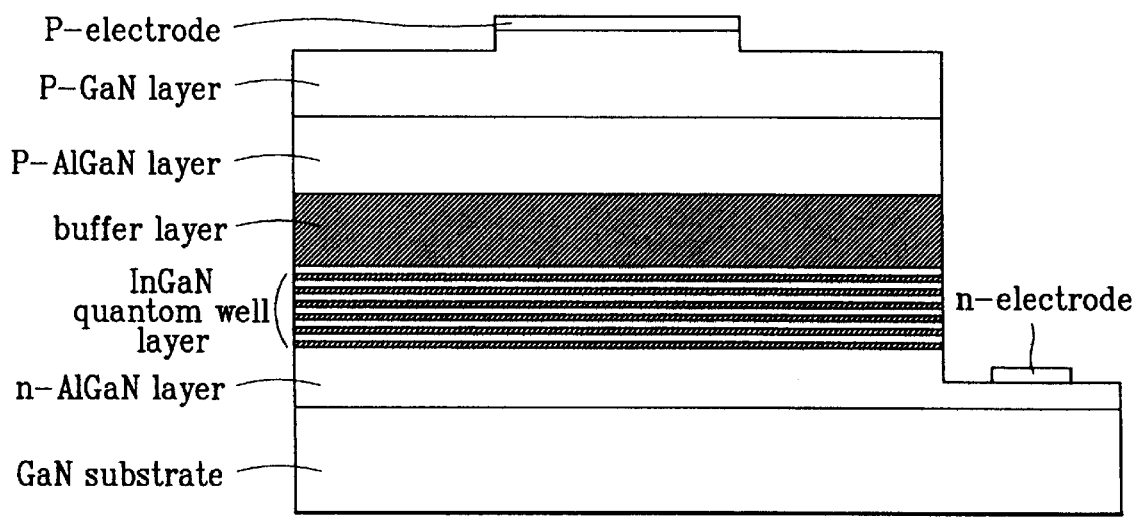

FIG. 1 shows an energy band of a nitride semiconductor light-emitting element according to the present invention, and FIGS. 2A and 2B are sectional views of a nitride semiconductor light-emitting element according to the present invention.

As shown in FIG. 1, a buffer layer (dotted line portion) is formed between an InGaN active layer and an AlGaN cladding layer to protect the InGaN layer.

In other words, in the related art light-emitting element, an AlGaN cladding layer having a larger energy band gap is grown at a high temperature of 1000° C. or greater as soon as an active layer of a quantum well structure is grown at a low temperature of about 800° C. or less. For this reason, degradation is caused in characteristic of the active layer.

However, in the present invention, after an active layer of a quantum well structure is grown at a low temperature of about 800° C. or less, a buffer layer is grown at a temperature of about 900° C. or less within the range that characteristic of the active layer is unchanged. Then, an AlGaN cladding layer having a larger energy band gap is grown at a high temperature of 1000° C. or greater, so as to effectively protect the active layer.

A process for fabricating a nitride semiconductor light-emitting element will be described in more detail with reference to FIGS. 2A and 2B.

FIG. 2A shows a nitride semiconductor light-emitting element of a top-down type, in which a p type electrode is arranged over a substrate while an n type electrode is arranged below the substrate. FIG. 2B shows a nitride semiconductor light-emitting element of a two-top type, in which a p type electrode and an n type electrode are arranged over a substrate.

As shown in FIGS. 2A and 2B, an n type AlGaN cladding layer is grown on a GaN substrate, and an InGaN active layer of a quantum well structure is grown on the n type AlGaN cladding layer at a temperature of about 800° C. or less.

Subsequently, a buffer layer of any one of GaN, AlGaN, and InGaN is grown on the InGaN active layer at a temperature of about 900° C. or less. The growing temperature of the buffer layer should be within the range that characteristic of the active layer is unchanged. This is because that it is not possible to effectively protect the active layer if the growing temperature of the buffer layer is too low while the active layer may be damaged if the growing temperature of the buffer layer is too high.

Preferably, the buffer layer has a thickness of about 0.01~5 nm far thinner than the AlGaN cladding layer grown on the InGaN active layer or an intermediate buffer layer.

A composition of In in the buffer layer of InGaN should be smaller than that of In in the active layer.

Next, a p type AlGaN cladding layer and a p type GaN electrode layer are sequentially grown on the buffer layer. A p type electrode is formed over the p type GaN electrode layer while an n type electrode is formed below the substrate or over the n type cladding layer. Thus, the process for fabricating the light-emitting element is completed.

In the embodiment of the present invention, while the buffer layer has been only formed on the active layer, the buffer layer may be formed below the active layer.

As aforementioned, the nitride semiconductor light-emitting element and the method for fabricating the same have the following advantages.

By additionally growing the buffer layer, loss of the active layer that may occur due to rapid temperature variation is reduced and an epitaxial layer grown on the active layer has excellent crystallization characteristic. Thus, a rough interface caused by a difference between lattice constants of the active layer and its subsequent layers is prevented from occurring, thereby facilitating flow of carriers and improving efficiency of carrier confinement. As a result, it is possible to obtain a nitride semiconductor light-emitting element having high efficiency optical characteristic and thermal characteristic.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A nitride semiconductor light-emitting element, comprising:
    a substrate;
    a first conductivity type cladding layer formed on the substrate;
    an active layer formed on the first conductivity type cladding layer;
    a second conductivity type cladding layer formed on the active layer;
    a buffer layer formed either between the first conductivity type cladding layer and the active layer or between the second conductivity cladding layer and the active layer;
    a second conductivity type electrode formed over the second conductivity type cladding layer; and
    a first conductivity type electrode formed either below the substrate or over the first conductivity type cladding layer,
    wherein the buffer layer has a thickness of less than 5 nm.

2. The nitride semiconductor light-emitting element of claim 1, wherein the active layer is formed of InGaN and the buffer layer is formed of one of GaN, AlGaN, and InGaN.

3. A The nitride semiconductor light-emitting element of claim 2, wherein a composition of In of the buffer layer is smaller than a composition of In of the InGaN active layer if the buffer layer is formed of InGaN.

4. The nitride semiconductor light-emitting element of claim 1, wherein the first conductivity type is an n type while the second conductivity type is a p type.

* * * * *